United States Patent
Quenzer et al.

(10) Patent No.: US 7,410,828 B2
(45) Date of Patent: Aug. 12, 2008

(54) METHOD OF CREATING A PREDEFINED INTERNAL PRESSURE WITHIN A CAVITY OF A SEMICONDUCTOR DEVICE

(75) Inventors: Hans Joachim Quenzer, Itzehoe (DE); Peter Merz, Beldorf (DE); Marten Oldsen, Hamburg (DE); Wolfgang Reinert, Neumuenster (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 11/777,162

(22) Filed: Jul. 12, 2007

(65) Prior Publication Data

US 2007/0259470 A1   Nov. 8, 2007

Related U.S. Application Data

(63) Continuation of application No. PCT/EP2006/000040, filed on Jan. 4, 2006.

(30) Foreign Application Priority Data

Jan. 12, 2005   (DE) .................. 10 2005 001 449

(51) Int. Cl.
  *H01L 21/50*   (2006.01)
  *H01L 21/30*   (2006.01)
(52) U.S. Cl. .......................... 438/106; 438/456
(58) Field of Classification Search .......... None
  See application file for complete search history.

(56) References Cited

U.S. PATENT DOCUMENTS

| | | |
|---|---|---|
| 4,975,390 A | 12/1990 | Fujii et al. |
| 5,323,051 A | 6/1994 | Adams et al. |
| 5,872,309 A | 2/1999 | Pinter |
| 5,985,412 A | 11/1999 | Gosele |
| 6,467,354 B1 | 10/2002 | Allen |
| 2004/0057043 A1 | 3/2004 | Newman et al. |
| 2004/0077117 A1 | 4/2004 | Ding et al. |
| 2005/0230708 A1 | 10/2005 | Riechenbach et al. |

FOREIGN PATENT DOCUMENTS

| | | |
|---|---|---|
| DE | 3743080 | 7/1988 |
| DE | 19648759 | 5/1998 |
| DE | 19651384 | 6/1998 |
| DE | 19739961 | 4/1999 |
| DE | 19961578 | 6/2001 |
| FR | 1210447 | 3/1960 |

OTHER PUBLICATIONS

Shelby, J. Helium Migration in Glass-forming Oxides. J. Appl. Phys. vol. 43, No. 7. Jul. 1972.

*Primary Examiner*—Scott B. Geyer
(74) *Attorney, Agent, or Firm*—Glenn Patent Group; Michael A. Glenn

(57) ABSTRACT

A method of creating a predefined internal pressure within a cavity of a semiconductor device, the method including providing the semiconductor device, the semiconductor device including a semiconductor oxide area which is continuously arranged between the cavity of the semiconductor device and an external surface of the semiconductor device, exposing the semiconductor device to an ambient atmosphere with a noble gas at a first temperature for a predetermined time period, and setting a second temperature, which is different from the first, after the predetermined time period has expired, the semiconductor oxide area exhibiting a higher permeability for the noble gas at the first temperature than at the second temperature.

18 Claims, 5 Drawing Sheets

METHOD OF CREATING A PREDEFINED INTERNAL PRESSURE WITHIN A CAVITY OF A SEMICONDUCTOR DEVICE

CROSS-REFERENCE TO RELATED APPLICATIONS

This application is a continuation of copending International Application No. PCT/EP2006/000040, filed Jan. 4, 2006, which designated the United States and was not published in English.

TECHNICAL FIELD

The present invention relates to a method of creating a predefined internal pressure within a cavity of a semiconductor device.

BACKGROUND

Microresonators, vibration sensors, vibrating gyroscopes and microelectro-mechanical systems, for example made of silicon, may be produced at low cost and in large numbers using methods derived from microelectronics. Due to the small dimensions of the components, these vibrators must be operated in a vacuum. In the case of the resonators, the pressure within the cavity typically ranges from about $1*10^{-4}$ mbar to about 1 mbar.

Since hermetically sealed housing technology based on individual devices is comparatively expensive and additionally necessitates the devices to be protected already during the sawing of the silicon wafers, encapsulation of the resonators as early as at the wafer level is widespread. In this context, the wafer which includes the device has a second silicon wafer provided with respective depressions placed thereon, which is finally bonded to the first wafer under vacuum in a hermetically sealed manner. Various methods are contemplated as the interconnection technique used: on the one hand, the wafers may be joined using a glass or metallic solder, on the other hand, the wafers may also be sealed by means of anodic bonding.

Prior to the actual bonding, the wafers are adjusted and fixed within a clamp. Thin spacers between the wafers ensure that the wafers do not contact one another directly. Once the entire clamping arrangement has been introduced, the space around and between the wafers is evacuated, the top and bottom wafers are heated up by means of heating plates, subsequently the wafer surfaces are made to contact one another (once the spacers have been removed), and eventually, the actual bonding is performed.

The thickness of the spacers used ranges from 50 to 500 µm. However, the distance between the wafers already ranges within a dimension which approximately corresponds to the mean free path of the gas molecules at pressures of below 1 mbar, so that diffusion processes primarily determine the behavior of the gases within the spacings of the wafers, as a result of which it becomes clearly more difficult and more time-consuming to remove the gases.

Due to the small distance between the wafers and the comparatively unfavorable ratio between the internal volume and the interior surface within the cavities within the semiconductor devices, for example sensors, experience has shown that it is difficult to join the wafers such that an internal pressure of clearly below 1 mbar may be achieved.

To aggravate the situation, the set pressure within different cavities of the semiconductor devices arranged on the wafer is not constant due to the comparatively slow outgassing of the surfaces between the wafers. While the cavities with the semiconductor devices frequently acquire pressures of clearly below 1 mbar at the wafer edge, the vacuums obtained within the various cavities, which are located further inward within the wafers, are mostly clearly worse. Thus, a pressure distribution arises during the evacuation of the wafers prior to the bonding, the minima of said pressure distribution being located at the wafer edge, and their maxima being located in the wafer center. Introducing breakdowns in the top or bottom wafers entails no advantage, since the wafers are in contact with the top and bottom heating plates, respectively, during bonding.

Eventually, it is only by means of an additional getter material within the sensor cavity that low internal pressures within the cavities may be achieved within a process duration and with a uniformity across the wafer which are suitable for mass production. Even though the getter material necessitates additional activation either during or after the actual bonding process, which additional activation extends the time duration of the bonding process, vacuums ranging from $10^{-4}$ to 1 mbar may be ensured only by using a getter. Utilization of a getter is also absolutely imperative with regard to the lifetime of at least 10 to 15 years which is usually envisaged.

However, ensuring the vacuum only superficially solves all problems of vacuum encapsulation of the cavities within the semiconductor devices, for example sensors. Actually, semiconductor devices comprising cavities, such as resonantly operated sensors, do not simply necessitate a vacuum below a critical pressure value within the cavity, but, rather, a vacuum within a certain pressure range is necessitated, i.e. gases, as a rule noble gases, which are not absorbed by the getter material, need to be added in order to place the pressure within the cavity within the desired pressure range, or to keep it there.

However, due to the small distance between the wafers and, thus, to the presence of a pressure regime characterized by a diffusion behavior, introducing the gases is as difficult and/or imperfect as have been the previous attempts to achieve the vacuum solely by means of evacuation. In particular, the achievable uniformities of the distribution of the internal pressures within the cavities of the sensors or semiconductor devices across the wafer prove to be insufficient for a necessitated functionality of the devices.

An improvement may be achieved by employing a gas mixture consisting of nitrogen and some fractions of a noble gas, such as argon. Thus, the wafers are exposed to a pressure of about 5 mbar immediately prior to bonding. Utilization of the increased pressure allows a faster pressure compensation also between the wafers, since with this pressure regime, the behavior of the gases is no longer fully determined by diffusion processes. After bonding, the getter absorbs the remaining nitrogen, while the noble gas remains within the cavity, or sensor cavity.

Even though the results achieved with above methods of creating an internal pressure within a cavity yield an improvement in the pressure distribution, or internal pressure distribution, between a number of semiconductor devices by setting a predetermined pressure within the environment prior to bonding the wafers, the results achieved are nevertheless not sufficient for a correct functionality of the devices thus realized.

SUMMARY

According to an embodiment, a method of creating a predefined internal pressure within a cavity of a semiconductor device may have the steps of: providing the semiconductor device, the semiconductor device comprising a semiconductor oxide area which is continuously arranged between the cavity of the semiconductor device and an external surface of the semiconductor device; exposing the semiconductor device to an ambient atmosphere with a noble gas at a first temperature for a predetermined time period; and setting a second temperature, which is different from the first, after the predetermined time period has expired, the semiconductor oxide area exhibiting a higher permeability for the noble gas at the first temperature than at the second temperature, the step of exposing being performed such that the noble gas is neon.

The present invention is based on the findings that with a semiconductor device comprising a semiconductor oxide area, such as made of $SiO_2$, between a cavity and an external surface of the semiconductor device, the semiconductor oxide area may be used as some sort of valve for passing a specific noble gas so as to achieve a predefined internal pressure. In particular, a finding of the present invention is that a predetermined internal pressure may be achieved in that the device is exposed to a noble-gas atmosphere at a first temperature, at which the semiconductor oxide area is pervious, or permeable, to the noble gas, and/or at which the valve is open, and is then reset to a different temperature at which the semiconductor oxide area is less pervious or impervious, or less permeable or non-permeable, to the noble gas, and/or at which the valve is closed, and which lies, for example, within a target utilization temperature range of the semiconductor device, i.e. at the admissible operating temperature. By means of suitably setting the noble-gas ambient atmosphere as well as the time duration of the exposure, introduction of atoms of the noble gas through the semiconductor oxide area into the cavity of the semiconductor device may be controlled such that a desired pressure will subsequently arise within the cavity.

What is advantageous about the inventive method of creating a predefined internal pressure is that the method is based on a state in which the cavities have already been formed. As a result, the method may be performed both at the wafer level and on the chips which have already been separated, and/or at the chip level.

A further advantage of the present invention is that the pressure of the noble gas atmosphere may be larger, and advantageously is larger, than the internal pressure desired, so that a very homogeneous setting of the internal pressure across a large number of semiconductor devices, which may be arranged, for example, on a wafer, may be achieved. Put differently, the semiconductor devices arranged on a wafer may all be uniformly surrounded by neon. In this manner, the inventive method of creating a predefined internal pressure within a cavity of a semiconductor device is highly controllable. At the same time, this enables the internal pressure within a cavity to be very efficiently set to a predefined value.

The more homogenous distribution of the internal pressure across a number of devices which in one embodiment of the present invention are arranged, for example, on a wafer, results in that a larger fraction of the devices exhibit an electrical functionality which is within a range specified for the utilization of the devices. Thus, the yield is higher, which entails a reduction in the manufacturing cost as compared to a device wherein the internal pressure within the cavity is set in accordance with a conventional method.

In addition, the present invention offers the possibility of using the exposure of the semiconductor device to a noble gas atmosphere by, for example, introducing a noble gas into a process chamber within which the device is also arranged, as a high-fineness leak test. Chips exhibiting defect bonding actually will have, once they have been exposed to the noble gas atmosphere, or to the overpressure, an internal pressure which is clearly to high. In this manner, chips exhibiting a defect bonding may be recognized very quickly in a subsequent test method. Of course, the same also applies to devices at the wafer level.

In all, the internal pressure within the cavity of the semiconductor device may be set, in the inventive method, both at the chip level and at the wafer level or even within a wafer batch. Thus, this method exhibits a very high level of flexibility.

A further advantage of the method of creating a predefined internal pressure within a cavity of a semiconductor device is that a getter employed in one embodiment of the invention is not additionally loaded. The getter may be implemented such that a noble gas is not absorbed by it. In addition, the method of creating a predefined internal pressure within a cavity of a semiconductor device may be combined with activating the getter. What is particularly advantageous in this context is that during the exposure, the temperature and the exposure time duration may be set such that the getter is activated. While the predefined internal pressure will set itself in the first ambient atmosphere state, the getter will at the same time remove undesired gas atoms within the cavity. Thus, semiconductor devices may be manufactured in a very efficient manner wherein an internal pressure within a cavity is to have a predefined value.

BRIEF DESCRIPTION OF THE DRAWINGS

Embodiments of the present invention will be detailed subsequently referring to the appended drawings, in which.

DETAILED DESCRIPTION

Figure 1:
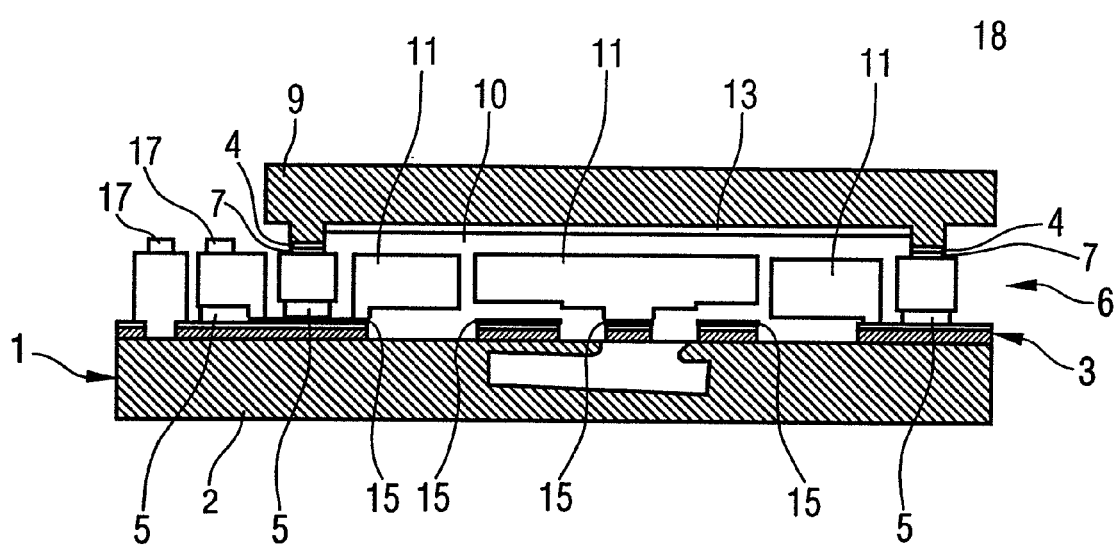
FIG. 1 shows a semiconductor device comprising a cavity, wherein a method in accordance with an embodiment of the present invention may be employed.

FIG. 1 depicts a semiconductor device comprising a cavity within which a predefined internal pressure is to be created, for which purpose a method in accordance with an embodiment of the present invention may be used.

FIG. 1 shows a substrate 2 having a structured layer 3 made of polysilicon applied thereto, which in turn has structures arranged thereon which comprise areas 5 made of silicon dioxide, electrically conductive layers such as made of polysilicon, 15 and a structured layer 6, such as an epitactic polysilicon layer. This arrangement has a substrate 9 arranged thereon which serves as a cover, and which in turn has a structured silicon oxide layer 4 deposited on its side facing the substrate 2, upon which structured silicon oxide layer 4 a bond metal, such as gold, 7, is deposited. Via bond metals 7, cover 9 is mechanically connected to the bottom arrangement comprising substrate 2. Laterally, areas 7 consisting of bond metal and/or the bond areas are arranged such that a cavity 10 which is more or less hermetically sealed is formed by substrate 2, silicon dioxide layers 4 and 5, areas 7, polysilicon layer 6 and cover 9, as will become apparent from the discussion below.

Within cavity 10, polysilicon areas 11 which define, for example, a micromechanical structure, such as a vibration or resonance structure, are formed within polysilicon layer 6. A getter 13 is arranged at cover 9, on that surface of same which is facing substrate 2, within cavity 10, i.e. inside the cavity.

FIG. 1 depicts, by way of example, a mean one of the polysilicon areas 11 such that it is arranged on an electrically conductive layer 15 which is arranged upon layer 3, and such that it may therefore be contacted therewith and/or be placed at a potential while parts of this mean area floatingly extend across further conductive portions of layer 15, so that mechanical bending or oscillating movements may be caused by applying voltages between last portions of layer 15 and the mean silicon area 11.

Two terminal pads, such as aluminum pads, 17 are arranged outside the arrangement surrounding cavity 10. One of the two aluminum pads 17 is electrically coupled to substrate 2, while the other aluminum pad 17 is electrically coupled, via conductive layer 15, to a further one of the polysilicon areas 11 which is spaced away, by a gap, from the freely movable end of the cantilever of the mean area 11, and may thus serve, for example, to fine-tune the resonant frequency by setting a potential difference between the two adjacent areas.

As may be seen, at 4 and 5 a continuous path of silicon dioxide extends between cavity 10 and the exterior 18 of the semiconductor device shown. In the method which will described below of setting a desired internal pressure within cavity 10, use is now made of the continuous path and of the property of silicon dioxide which consists in that same comprises a higher permeability for a noble gas present in the environment 18 of the semiconductor device under certain circumstances than under other circumstances.

With reference to FIG. 1, it shall be noted that in the provision or production of the semiconductor device of FIG. 1, a multiplicity of such devices are jointly generated, for example, in that structures 3, 5, 6 as have been described above are generated at a multiplicity of areas on a wafer 2, and that thereafter, a multiplicity of covers 9, in a state in which they are arranged on a further wafer, are bonded to these structures such that cavities 10 result, that pressure under which the bonding takes place being smaller, for example, than that pressure which is desired and subsequently is to be set by the method to be explained below. The following method may be applied both to the individual devices in their separated states, i.e. to device chips, namely individually or in groups, or to the wafer 2 in a state in which it is provided with covers 9.

In the following, FIG. 2 will illustrate a method of creating the predefined, or desired, internal pressure within the cavity 10 within the semiconductor device depicted in FIG. 1.

In a step S1, the semiconductor device as has been depicted and described, for example, in FIG. 1, is provided.

Subsequently, the semiconductor device is exposed, in a step S3, to an ambient neon atmosphere for a predetermined time duration at a first temperature at which the neon may diffuse through the silicon dioxide. To this end, the device is introduced, for example, into a process chamber, whereupon neon is introduced into the process chamber, so that the semiconductor device is present within an ambient atmosphere which at least comprises neon gas. During the exposure, a temperature, or ambient temperature, of the ambient atmosphere within the chamber is set, for example, to a value of between 200 and 700° C., and, advantageously, to a value of between 300 and 400° C. A pressure within the process chamber during exposure is set, for example, to a value of between 2 an 20, and, advantageously, to a value within the range of from 3 to 7 bar, and particularly advantageously to 4 bar. The temperature and pressure within the chamber which have thus been set are maintained for a period of time, while the device is located in the neon atmosphere thus set. During this time period, neon enters, or diffuses, into the cavity via the above-mentioned continuous path extending within the silicon dioxide between the exposed outer surface of the device and the interior of the cavity, the diffusion rate depending on the difference between the internal pressure within the device cavity and the pressure within the process chamber, which is why the desired internal pressure may be set by suitably selecting the exposure time and the chamber pressure. The exposure time ranges from, for example, 30 to 240 minutes.

It shall be noted that it might be possible, depending on the circumstances, to not set the entire ambient neon temperature within the process chamber to the above-mentioned permeation temperature during the exposure S3. Rather, it would also be possible, for example, to perform a local warming of or at the silicon dioxide, such as by resistive traces which may be specifically provided for this purpose and which extend along the and at a small distance from the continuous paths which extend within the silicon dioxide between the interior of the cavity and the exterior.

In other words, an internal pressure builds up within cavity 10 of the semiconductor device. This internal pressure is caused by the fact that particles, or atoms, of the neon located within the process chamber diffuse into cavity 10 through silicon dioxide layers 4, 5. Here, one takes advantage of the properties of silicon dioxide layers 4, 5, which consist in that they comprise a higher permeability, under those conditions for the neon which have been set within the process chamber, than in a target application area, or under admissible operational conditions of the semiconductor device, which typically do not exceed 120° C.

Subsequently, in a step S5, the exposure S3 is terminated, and/or the temperature is reset from the permeation temperature to a cooler temperature where no diffusion of neon through the silicon dioxide takes place. This is performed, for example, simply by removing the semiconductor device from the process chamber once the predetermined time period has expired. Under the normal conditions outside the process chamber, the temperature is cooler, so that the permeability of the silicon dioxide layers 4, 5 for the neon is considerably lower than in the ambient atmosphere state, or under the conditions of the ambient atmosphere which is/are set within the process chamber, or is approximately zero. The neon atoms which have entered cavity 10 during processing of the semiconductor device thus remain within cavity 10 under the conditions of the target application area, so that the internal pressure which is dependent on the concentration of the neon atoms within cavity 10 remains approximately constant over the lifetime of the semiconductor device under the conditions of the target application area.

After step S5, the cavity could finally be hermetically sealed by means of an encapsulation material, for example in the context of a packing step, the encapsulation material particularly covering, for example, the exposed places of the silicon dioxide, so as to prevent any continuous path between the interior of the cavity and the exterior within the silicon dioxide.

For example, a determination of the internal pressure within the cavity after performing a inventive processing of semiconductor devices at a neon pressure of 4 bar, a neon temperature of 300° C., and an exposure and/or effective period of 60 min, has shown that the internal pressure present within cavity 10 is around a value of 10 Pascal.

In the above embodiment of the present invention, the permeability of silicon dioxide with regard to neon has been exploited. Similar diffusion effects, or permeability fluctuations depending on the temperature, could also be ascertained, however, with other combinations of noble gases and semiconductor oxides. In the case of neon with silicon dioxide, the permeability during exposure is advantageously higher, by a factor within a range from 500 to 5000, than under normal conditions, or in the admissible operating temperature range, or, for example, at 85° C., as a reference.

In the above embodiment of the present invention, a temperature within a range about 300° C. was advantageous. However, any temperatures at which the atoms of the neon can penetrate the silicon dioxide layers 4, 5 may be set within the process chamber.

In the above embodiment of the present invention, substrate 2 and cover 9 and the layers located thereon are mechanically interconnected via a metal bond 7. However, alternatives thereto are any connections, such as silicon bonds or silicon dioxide bonds or joints by means of glass or metal solders.

In the above embodiment of the present invention, a pressure of 4 bar within the process chamber was advantageous, however, any pressures in the environment may be set at which the atoms of the neon gas may penetrate the silicon dioxide layer, and may thus enter cavity 10 from the environment of the semiconductor device.

In the previously mentioned attempt in accordance with an embodiment of the present invention, the semiconductor device was processed within the process chamber under the above-mentioned conditions for a time period of about an hour. However, any time periods are feasible for setting the pressure within cavity 10 to a predefined value. In this context, the time period, or the time duration, during which the semiconductor device is processed under that condition of the ambient atmosphere which is set within the process chamber, is advantageously within a range of from 20 min to 20 h and, more advantageously, within a range of about 1 h.

In the above-cited example of the method in accordance with the present invention, an internal pressure of 10 Pa was set within cavity 10 within the semiconductor device. However, any internal pressures may be set, by means of the method, within cavity 10 which are lower than the pressure prevailing within the process chamber during the processing of the semiconductor device. However, an internal pressure within a range from 0.01 Pa to 100 Pa, and more advantageously, within a range of about 10 Pa, is set.

In the above embodiment of the present invention, the neon enters cavity 10 of the semiconductor device via the silicon dioxide layers shown in FIG. 1. Alternatively, however, any semiconductor oxide layers which exhibit a higher permeability for a noble gas during the processing within the process chamber than under the ambient conditions of the target value range may be arranged between cavity 10 and the surroundings of the semiconductor device.

In the above embodiment of the present invention, the semiconductor device is, for example, an encapsulated microresonator or an encapsulated vibrating gyroscope, but any semiconductor devices comprising a cavity are alternatives.

Advantageously, a getter activation, for example of getter 13 in FIG. 1, is simultaneously performed during the processing of the semiconductor device within the process chamber, a getter activation requiring, for example, an effective temperature of 350° C. over a time period of 30 min. The getter 13 is advantageously a layer containing zirconium and/or titanium and absorbing the gas atoms located within cavity 10. Advantageously, the neon gas atoms which enter cavity 10 during the process are not absorbed by getter 13. This results in that predominantly neon gas atoms are found within cavity 10 once the method, depicted in FIG. 2, in accordance with an embodiment of the present invention has been performed. Thus, the internal pressure within cavity 10 may be efficiently set to a predefined value.

Figure 2:
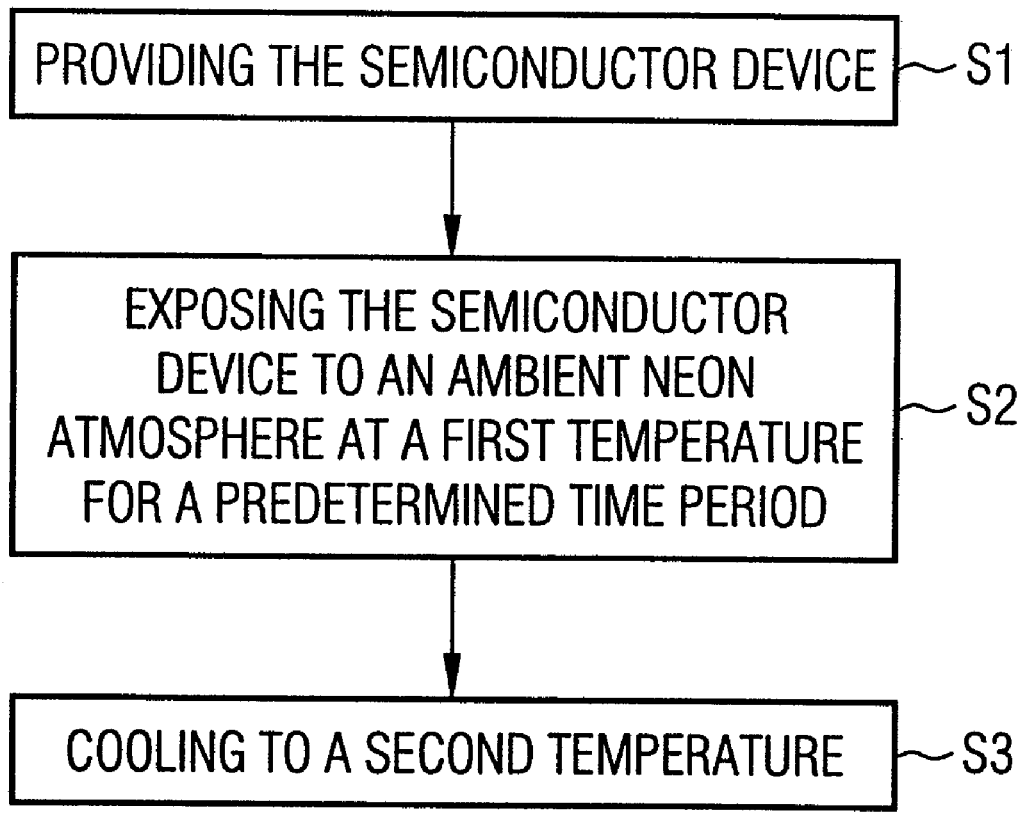
FIG. 2 shows a method of creating a predefined internal pressure within a cavity of a semiconductor device in accordance with an embodiment of the present invention.

In the method, depicted in FIG. 2, in accordance with an embodiment of the present invention, the properties of neon are exploited for tuning, or setting, the internal pressure within cavity 10 of a semiconductor device, such as a sensor, for example. This may advantageously be effected after bonding of a semiconductor device, and/or even after separating the semiconductor device. Bonding of the semiconductor device is understood to mean the manufacturing step wherein cover 9 and the layers disposed thereon are attached, for example, as in the case of FIG. 1, by connecting gold 5 with silicon 6, or by melting two bond metals which are each disposed on the material structure comprising substrate 2, and/or on the material structure comprising cover 9, so that cavity 10 results, specifically, in accordance with the present invention, such that a semiconductor oxide area extends in an uninterrupted manner between cavity 10 and the exterior.

What is particularly advantageous about the method shown in FIG. 2 is that the semiconductor devices are freely accessible after bonding, i.e. the neon gas may flow around the semiconductor devices comprising the cavities 10 on the wafer on all sides during the setting of the internal pressure, whereby inhomogeneities, if the semiconductor device is arranged on a wafer, may be avoided.

Figure 3:
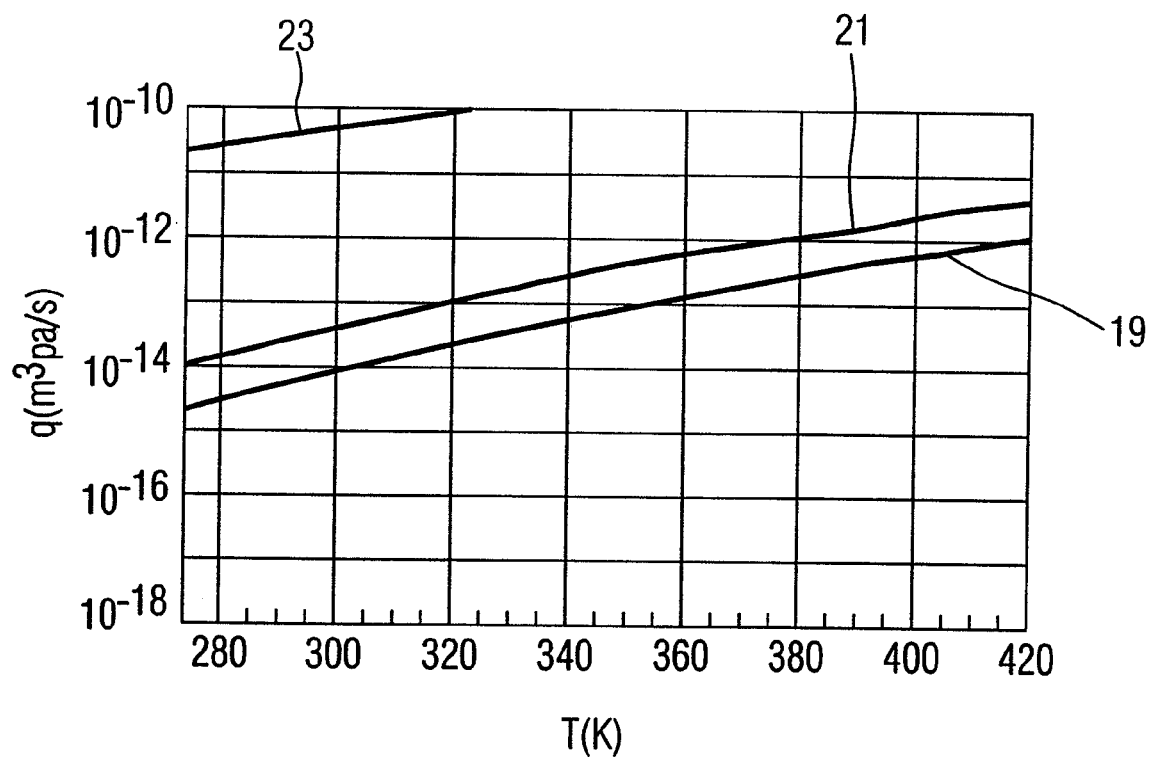
FIG. 3 shows a graph with permeability values for permeations of various gases through silicon dioxide.

FIG. 3 illustrates the temperature dependence of the permeability values for H and the noble gases He and Ne in relation to silicon dioxide at 4 bar. The temperature is linearly plotted in Kelvin on the x axis, while the permeability is logarithmically plotted in $m^3$ Pa/sec on the y axis. A curve 19 explains a course of the permeability for neon, a curve 21 a course of the permeability for hydrogen, and a curve 23 a course of the permeability for helium, at an ambient pressure of 4 bar in each case. In this context, the permeability is a measure of how fast the respective gases may enter, or diffuse into, for example, cavity 10 of the semiconductor device shown in FIG. 1.

The permeability for all gases depicted is dependent on the temperature and exponentially increases as the temperature, or ambient temperature, at the semiconductor device increases. FIG. 3 also shows that helium exhibits a higher permeability than hydrogen, which in turn has a higher permeability than neon. Due to the increase in permeability as the temperature increases, at a temperature of about 330° C., neon (see FIG. 4) reaches the same value as helium does at room temperature. The curve characteristic depicted in FIG. 3 also indicates that helium diffuses into cavity 10 at a rate which is about 5000 times higher than that of neon.

A more detailed analysis of the conditions reveals that the permeation of neon at 300° C.-400° C. is sufficiently large to be able to set the pressure within a relatively short time period, advantageously several hours, but that, on the other hand, the permeation within the range of room temperature is hardly measurably and sufficiently small so as to avoid any appreciably neon losses even over a time period of 10 to 15 years at an envisaged internal pressure of, e.g., 10-40 Pascal.

Figure 4:
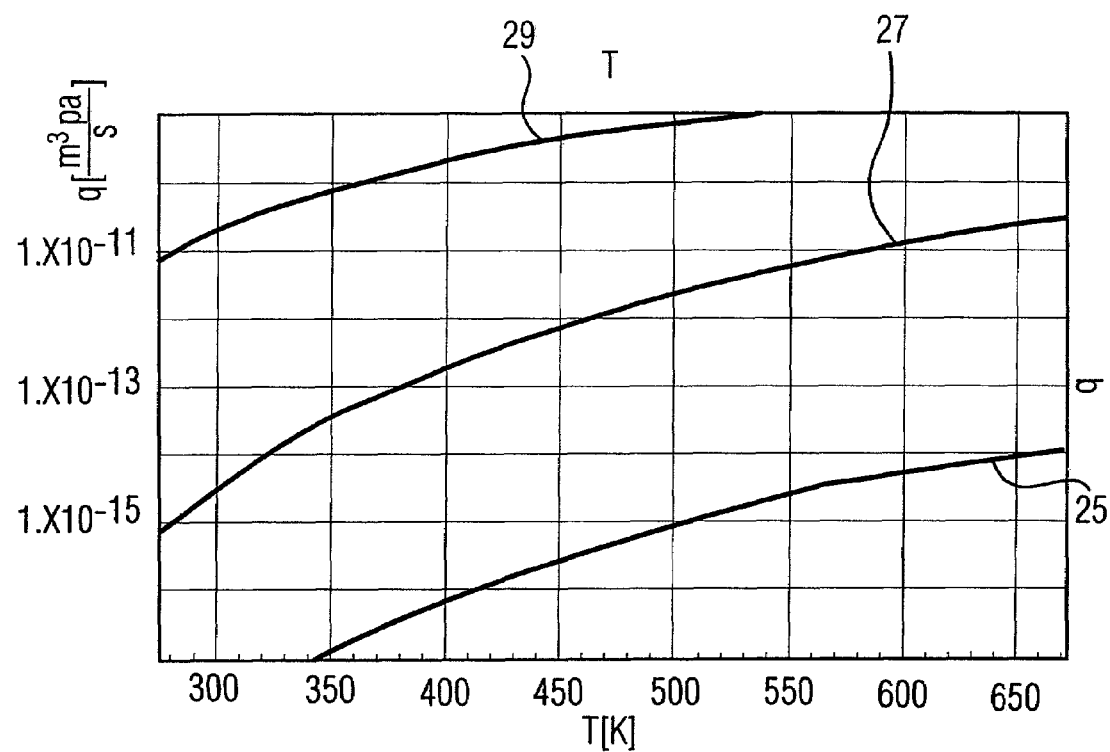
FIG. 4 shows a graph with permeability values for permeations of various noble gases through silicon dioxide layer for partially differing differential pressures.

FIG. 4 illustrates the temperature dependence of the permeability values for neon and helium in terms of the semiconductor device with regard to silicon dioxide partially for different differential pressures between the chamber and the interior of the cavity. The temperature values are plotted, on a linear scale, on the x axis of the graph depicted in FIG. 4, while the permeability values are plotted on a logarithmic scale on the y axis. A curve characteristic 25 illustrates the permeability for neon at a pressure difference of 0.4 mbar, whereas a curve characteristic 27 depicts the permeability for neon at a pressure difference of 1 bar. A curve characteristic 29 represents the permeability for helium at a pressure difference of 1 bar.

It may be seen that the permeability depends on the pressure difference, i.e. that at a specific temperature, the permeability of neon is considerably higher at a pressure difference of 1 bar than at a pressure difference of 0.4 mbar. The pressure difference occurs between the internal pressure found within cavity 10 and an ambient pressure. It may also be seen from the graph in FIG. 4 that the permeation at room temperature, or under ambient conditions, within a target application area of the semiconductor device is within a range which is necessitated for the functionality of the semiconductor device. This means that the permeation within the target application area of the semiconductor device is so high that over the lifetime of the semiconductor device, which ranges, for example, from 10 a to 15 a, it is only to a small extent that neon gas atoms diffuse, or exit, from cavity 10 through silicon dioxide layers 4, 5 into the environment of the semiconductor device. Thus, the predefined internal pressure created within cavity 10 remains approximately constant over the lifetime of the semiconductor device.

The target application area of the semiconductor device is understood to mean the ambient conditions under which the semiconductor device may be employed in accordance with the specified values, or for which the employment, or operation, is envisaged in accordance with the relevant provisions. These are typically an atmospheric pressure within a range of around 1 bar, and within a temperature range of from –50° C. to 130° C., or within a smaller range.

Figure 5A:
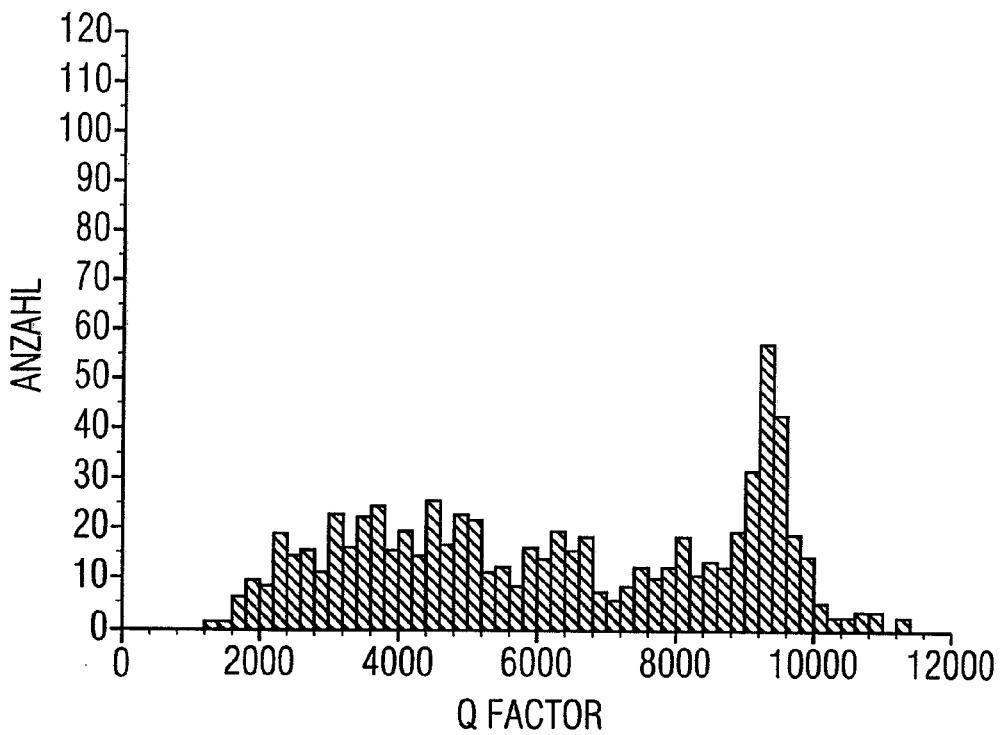
FIGS. 5A and 5B show comparative representations of a distribution of quality factors with a specific amount of microsensors prior to and after an overpressure test with helium.
Figure 5B:
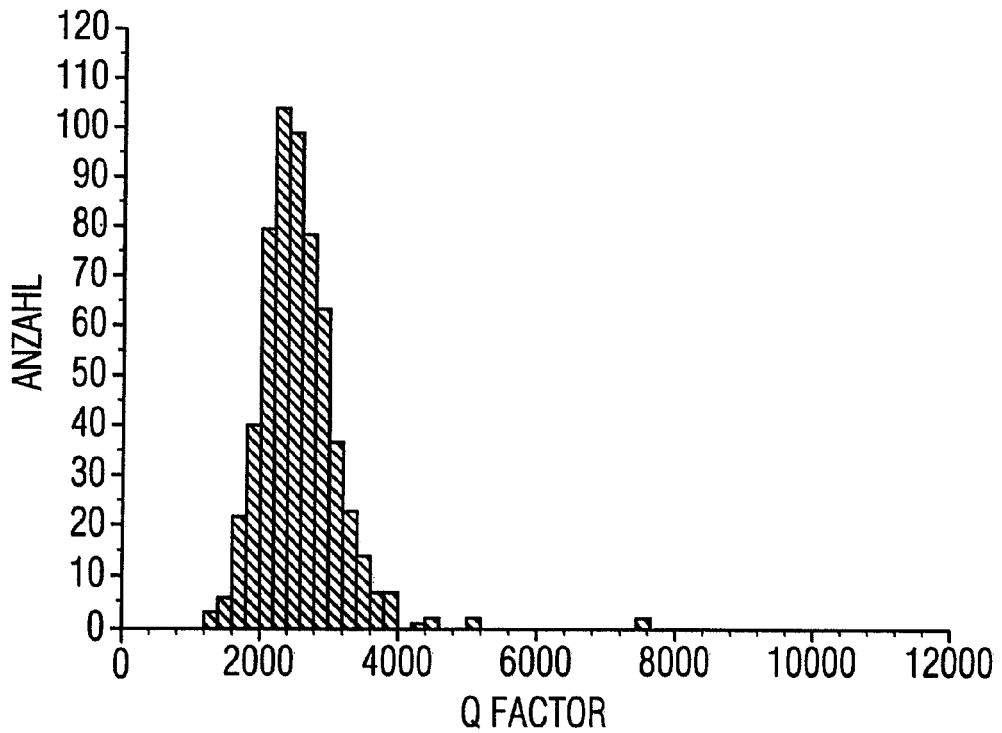

In order to illustrate the positive influence exerted by the method of FIG. 2 on the fluctuation of the interior pressures of devices processed in the same manner, FIGS. 5a-B depict comparative representations of a distribution of the quality, or quality factor, in a predefined number of microresonators encapsulated, for example, in accordance with FIG. 1, prior to and after an overpressure test with helium, i.e. a test at which helium enters the cavity at an overpressure atmosphere. Since the microsensors are not fully formed with silicon only, but also comprise, in portions, insulating layers made of $SiO_2$ (cf. FIG. 1), helium may be observed to enter during an overpressure test.

FIG. 5A represents the distribution of the quality, or Q, factor within the number of microresonators prior to the helium test, while FIG. 5B depicts the distribution of the quality of the microresonators after the helium test.

The x axis has plotted thereon the range boundaries of the quality within which a number of microresonators of the plurality of microresonators, which are plotted on the y axis, are found. FIG. 5B shows, also plotted on the x axis, the range boundaries within which a quality is found, whereas the y axis has in turn plotted thereon the number of microresonators which exhibit a quality within the respective range.

The microresonators, or microsensors, are arranged within cavity 10 within which the internal pressure is set to a predefined value on account of helium entering during an overpressure test. The helium predominantly enters cavity 10 via silicon dioxide layers 4, 5.

FIG. 5B shows that by setting the internal pressure within cavity 10 during the overpressure test with helium, a more homogeneous distribution of the quality of the microresonators may be achieved. While in FIG. 5A, a considerable number of microresonators exhibited a quality ranging from about 2,000 to about 10,000, the quality of the microresonators after the overpressure test with helium is concentrated within a range from 1,600 to 4,000.

The quality is highly dependent on the internal pressure within cavity 10. Thus, the distribution of the quality across the number of the microresonators examined is a measure of the distribution of the internal pressure across the quantity of the microresonators examined, and the internal pressure of the sensors may be derived from the attenuation and from the quality of the resonators resulting therefrom.

After the helium test, the distribution of the quality and, thus, of the internal pressure within cavity 10 in the number of microresonators examined is more homogeneous, i.e. the uniformity of the internal pressure within the cavities of the respective microresonators is higher. In other words, the fluctuations of the quality among the individual microresonators of the quantity examined are smaller after the helium test. Thus, an internal pressure was set within cavity 10 by means of the helium test. For continuous utilization of the devices after the helium test, however, they must subsequently be treated within an extremely low temperature range so as to prevent any further losses of helium.

It shall be pointed out that, similarly to the above-described procedure, the neon may again be removed, after overfill has been effected, within a temperature-regulated vacuum chamber, from the internal volume of the semiconductor devices, for which purpose, however, the exposure time may possibly take several days.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method of creating a predefined internal pressure within a cavity of a semiconductor device, the method comprising:
   providing the semiconductor device, the semiconductor device comprising a semiconductor oxide area which is continuously arranged between the cavity of the semiconductor device and an external surface of the semiconductor device;
   exposing the semiconductor device to an ambient atmosphere with a noble gas at a first temperature for a predetermined time period; and
   setting a second temperature, which is different from the first, after the predetermined time period has expired,
   the semiconductor oxide area exhibiting a higher permeability for the noble gas at the first temperature than at the second temperature,
   the step of exposing being performed such that the noble gas is neon.

2. The method as claimed in claim 1, wherein the step of exposing the semiconductor device to the ambient atmosphere comprises the following substeps:
   setting a predetermined ambient pressure and a predetermined ambient temperature within the ambient atmosphere for the predetermined time period.

3. A method as claimed in claim 2, wherein the step of setting the ambient pressure and the ambient temperature is performed such that the predetermined ambient pressure ranges from 2 bar to 20 bar.

4. The method as claimed in claim 2, wherein the step of setting the ambient pressure and the ambient temperature is performed such that the predetermined ambient temperature ranges from 200° C. to 700° C.

5. The method as claimed in claim 2, wherein the step of setting the ambient pressure and the ambient temperature is performed such that the predetermined ambient temperature ranges from 300° C. to 400° C.

6. The method as claimed in claim 1, wherein the step of exposing is performed such that the predetermined time duration ranges from 20 minutes to 20 hours.

7. The method as claimed in claim 1, wherein the step of exposing is performed such that the predetermined time period ranges from 20 to 240 minutes.

8. The method as claimed in claim 1, wherein the step of providing is performed such that the semiconductor oxide area comprises silicon dioxide.

9. The method as claimed in claim 1, wherein the noble gas, a semiconductor oxide of the semiconductor oxide area, and the first and second temperatures are selected such that the permeability for the noble gas is higher by a factor ranging from 500 to 50,000 at the first temperature than at the second temperature.

10. The method as claimed in claim 1, wherein the step of exposing is performed such that the predefined internal pressure ranges from 0.01 Pa to 100.

11. The method as claimed in claim 1, wherein the step of providing comprises providing an arrangement of several semiconductor devices on a wafer, and the steps of exposing and setting the temperature for all semiconductor devices are jointly performed.

12. The method as claimed in claim 1, wherein the step of providing is performed such that prior to the step of exposing, a pressure within the cavity is lower than the predetermined internal pressure.

13. The method as claimed in claim 1, wherein the step of providing comprises arranging a getter material within the cavity for, during activation, absorbing a different gas than the noble gas within the ambient atmosphere, the step of exposing being performed at least such that the getter material is activated.

14. The method as claimed in claim 1, wherein the providing is performed such that the semiconductor device comprises a micromechanical device.

15. The method as claimed in claim 1, wherein the providing is performed such that the semiconductor device comprises a microresonator or a vibrating gyroscope.

16. The method as claimed in claim 1, wherein the step of setting is performed such that the temperature ranges from −50° C. to 130° C. after the predetermined time period has expired.

17. The method as claimed in claim 1, wherein the step of setting is performed such that after the predetermined time period has expired, the temperature lies within a range which corresponds to the target application temperature range of the semiconductor device.

18. The method as claimed in claim 1, wherein the step of setting further comprises setting an ambient pressure to range from 0.9 bar to 1.2 bar.

* * * * *